US009673189B2

(12) United States Patent
Huang et al.

(10) Patent No.: US 9,673,189 B2
(45) Date of Patent: Jun. 6, 2017

(54) ESD UNIT

(71) Applicant: United Microelectronics Corp., Hsinchu (TW)

(72) Inventors: Chung-Yu Huang, Tainan (TW); Kuan-Cheng Su, Taipei (TW); Tien-Hao Tang, Hsinchu (TW); Ping-Jui Chen, Pingtung County (TW); Po-Ya Lai, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/924,975

(22) Filed: Oct. 28, 2015

(65) Prior Publication Data

US 2017/0125399 A1 May 4, 2017

(51) Int. Cl.
*H01L 27/02* (2006.01)
(52) U.S. Cl.
CPC .............................. *H01L 27/0262* (2013.01)
(58) Field of Classification Search
CPC .................................................. H01L 27/0262
See application file for complete search history.

(56) References Cited

U.S. PATENT DOCUMENTS

| 2009/0116157 | A1* | 5/2009 | Besse | H01L 27/0259 |
| | | | | 361/56 |
| 2014/0159206 | A1* | 6/2014 | Hsu | H01L 29/735 |
| | | | | 257/565 |
| 2015/0102384 | A1* | 4/2015 | Zhan | H01L 27/0262 |
| | | | | 257/173 |

OTHER PUBLICATIONS

Ya-Ting Lin et al., "Electrostatic Discharge Protection Device," Unpublished U.S. Appl. No. 14/728,053, filed Jun. 2, 2015.

* cited by examiner

*Primary Examiner* — Fernando L Toledo
*Assistant Examiner* — Neil Prasad
(74) *Attorney, Agent, or Firm* — J.C. Patents

(57) ABSTRACT

An electrostatic discharge (ESD) unit is described, including a first device, and a second device coupled to the first device in parallel. In an ESD event, the first device is turned on before the second device is turned on. The second device may be turned on by the turned-on first device to form an ESD path in the ESD event.

28 Claims, 5 Drawing Sheets

ESD UNIT

BACKGROUND OF THE INVENTION

Field of Invention

This invention relates to protection of an integrated circuit (IC), and particularly relates to an electrostatic discharge (ESD) unit for protecting an internal circuit from damage caused by an ESD event.

Description of Related Art

During an ESD event, a large current may flow through an IC and easily cause damage. The damage may occur within the device that conducts the current, and also in devices that is subjected to a significant voltage drop due to the large current flow. In order to avoid damage due to an ESD event, an ESD unit is usually added to the IC.

Conventionally, a gate-grounded metal-oxide-semiconductor (GGMOS) device and a gate-driven protect circuit are used as an ESD unit, but they require a large area of the IC chip. In order to reduce the area of the ESD unit, the silicon-controlled rectifier (SCR), especially LDMOS-inserted SCR, is recently used.

FIG. 1 illustrates a conventional SCR for ESD. The SCR typically has a PNPN structure that includes the $P^+$-region and the N-well at the drain side, and the P-well and the $N^+$-region at the source side, and may be considered to include a PNP bipolar junction transistor (BJT) and a NPN BJT coupled to the PNP BJT. The ESD path of the SCR is indicated by the arrow in the figure.

However, the ESD holding current of the conventional SCR tends to be lower than the maximal latch-up current ($I_{LU}$) in normal operation, so the latch-up immunity becomes worse and the leakage becomes larger. In addition, the trigger voltage needed to trigger the SCR is higher, so that the effect of preventing ESD damage is worse.

SUMMARY OF THE INVENTION

In view of the foregoing, this invention provides an ESD unit that has a larger holding current and a lower trigger voltage.

The ESD unit of this invention includes a first device, and a second device coupled to the first device in parallel. In an ESD event, the first device is turned on before the second device is turned on.

In an embodiment, the second device is turned on by the turned-on first device to form an ESD path in the ESD event.

In some embodiments, the first device comprises a GGNMOS or an NPN BJT. A GGNMOS is known to include a parasitic NPN BJT. In some embodiments, the second device comprises an SCR.

In an embodiment, the first device comprises, as a first NPN BJT, a parasitic NPN BJT in a GGNMOS, or a non-parasitic NPN BJT, the second device comprises an SCR that comprises a second NPN BJT and a PNP BJT, the base of the first NPN BJT is electrically connected to the collector of the PNP BJT, and the base of the second NPN BJT, the emitter of the first NPN BJT is grounded, the collector of the first NPN BJT is electrically connected to the emitter of the PNP BJT and an I/O pad, the emitter of the second NPN BJT is grounded, and the collector of the second NPN BJT is electrically connected to the base of the PNP BJT.

In some embodiments, the first device and the second device are planar devices.

In some other embodiments, the first device and the second device are three-dimensional (3D) devices, such as fin device.

In some embodiments, the ESD unit further comprises a trigger element coupled to the first device in series. In the ESD event, the trigger element is turned on by an electrostatic voltage, and the first device is turned on by the turned-on trigger element.

According to a first aspect of this invention, the trigger element is embedded in a region where the first device is formed.

According to a second aspect of this invention, the trigger element is coupled to the first device externally.

According to a third aspect of this invention, no trigger element is included.

When the first device and the second device are planar devices and the trigger element is an embedded element, the trigger element is also a planar device. When the first device and the second device are fin devices and the trigger element is an embedded element, the trigger element is also a fin device.

Since the first device that is coupled to the second device in parallel and turned on earlier than the second device is included in the ESD unit of this invention, the holding current can be increased, so that the latch-up immunity of the ESD unit is improved and the leakage in normal operation is decreased. Moreover, in a case where the trigger element is further included in the ESD unit of this invention, the trigger voltage required to trigger the SCR can be lowered so that the effect of preventing ESD damage is improved.

In order to make the aforementioned and other objects, features and advantages of the present invention comprehensible, a preferred embodiment accompanied with figures is described in detail below.

DESCRIPTION OF EMBODIMENTS

This invention will be further explained with the following embodiments and the accompanying drawings, which are not intended to restrict the scope of this invention.

Figure 1:
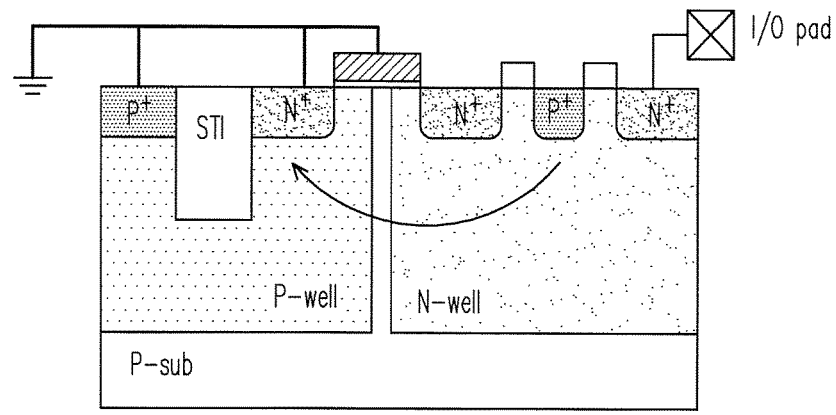
FIG. 1 illustrates a conventional SCR for electrostatic discharge.
Figure 2:
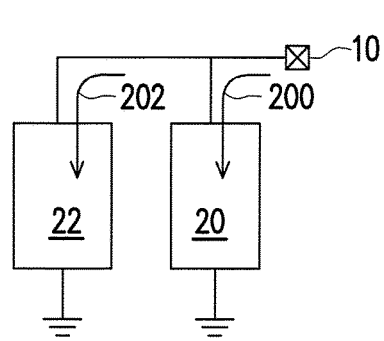
FIG. 2 illustrates a block diagram of an ESD unit according to a third aspect of this invention without a trigger element.

FIG. 2 illustrates a block diagram of an ESD unit according to the third aspect of this invention without a trigger element.

The ESD unit includes a first device 20, and a second device 22 coupled to the first device 20 in parallel, both of which are electrically connected to the I/O pad 10. In an ESD event, the first device 20 is turned on to flow a current 200 before the second device 22 is turned on. The second device 22 may be turned on by the turned-on first device 20 to form an ESD path 202 in the ESD event.

Figure 3:
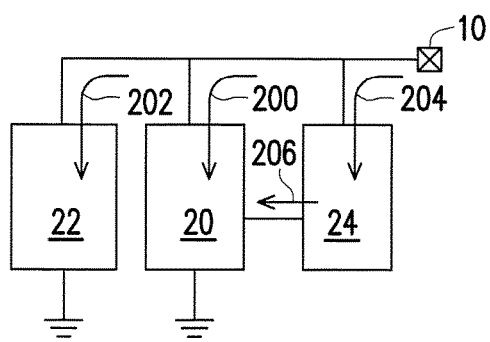
FIG. 3 illustrates a block diagram of an ESD unit according to first and second aspects of this invention with a trigger element.

FIG. 3 illustrates a block diagram of an ESD unit according to the first and second aspects of this invention with a trigger element.

As compared to the ESD unit as shown in FIG. 2, the ESD unit according to the first or second aspect further includes a trigger element 24 that is also electrically connected to the I/O pad 10. The trigger element 24 can be turned on by an electrostatic voltage, as indicated by the arrow 204. The first device 20 can be turned on by a signal 206 transmitted from the turned-on trigger element 24. The signal 206 may be a substrate current.

The trigger element 24 may include a diode, an RC-invertor, a diode couple device, or a CR circuit. The diode may be one that is formed using a shallow trench isolation (STI) layer, a gate layer, or a salicide blocking (SAB) layer as a mask, namely an STI diode, a gated diode, or an SAB diode. The diode may be an embedded diode that is embedded in a region where the first device 20 is formed. The RC-invertor, the diode couple device, or the CR circuit can be coupled to the first device 20 externally.

The first device 20 may include a GGNMOS or an NPN BJT. The GGNMOS is known to include a parasitic NPN BJT. The second device 22 may include an SCR. In the following embodiments, the first device includes a parasitic or non-parasitic NPN BJT and the second device includes an SCR.

Figures 4A, 4B, 4C:
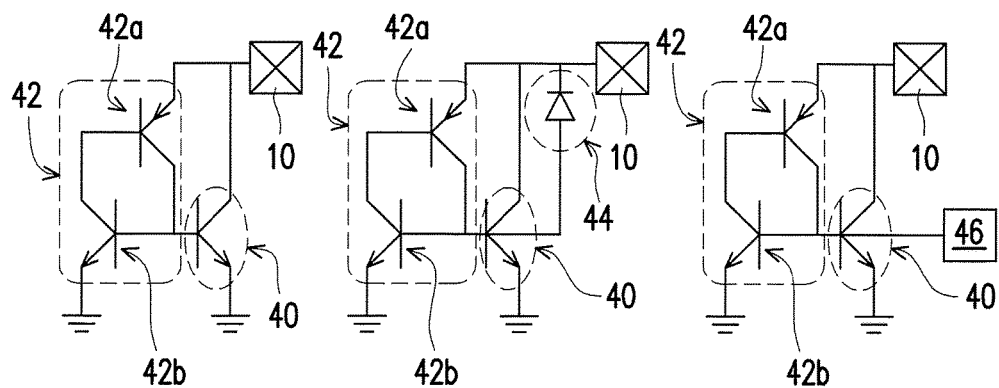
FIG. 4A illustrates a circuit diagram of an ESD unit according to certain embodiments in the third aspect of this invention.
FIG. 4B illustrates a circuit diagram of an ESD unit according to certain embodiments in the first aspect of this invention.
FIG. 4C illustrates a circuit diagram of an ESD unit according to certain embodiments in the second aspect of this invention.

FIG. 4A illustrates a circuit diagram of an ESD unit according to certain embodiments in the third aspect of this invention without a trigger element.

The ESD unit includes a parasitic or non-parasitic NPN BJT 40 as the first device, and a SCR 42 as the second device, wherein the SCR 42 includes a PNP BJT 42a and an NPN BJT 42b. The base of the NPN BJT 40 is electrically connected to the collector of the PNP BJT 42a, and the base of the NPN BJT 42b. The emitter of the NPN BJT 40 is grounded. The collector of the NPN BJT 40 is electrically connected to the emitter of the PNP BJT 42a and the I/O pad 10. The emitter of the NPN BJT 42b is grounded. The collector of the NPN BJT 42b is electrically connected to the base of the PNP BJT 42a.

FIG. 4B illustrates a circuit diagram of an ESD unit according to certain embodiments in the first aspect of this invention where the trigger element is embedded in a region where the first device is formed.

As compared to the ESD unit as shown in FIG. 4A, the ESD unit in embodiments in the first aspect of this invention further includes a trigger element that is an embedded diode 44. The positive electrode of the diode 44 is electrically connected with the base of the NPN BJT 40, and the negative electrode of the diode 44 is electrically connected with the I/O pad 10, the collector of the NPN BJT 40, and the emitter of the PNP BJT 42a. Accordingly, the terminal of the trigger element or the embedded diode 44 that is coupled to the base of the NPN BJT 40 is the positive electrode thereof.

FIG. 4C illustrates a circuit diagram of an ESD unit according to certain embodiments in the second aspect of this invention where the trigger element is coupled to the first device externally.

As compared to the ESD unit as shown in FIG. 4A, the ESD unit in embodiments in the second aspect of this invention further includes an externally coupled trigger element 46, such as an RC-invertor, a diode couple device, or CR circuit. The externally coupled trigger element 46 is coupled to the base of the NPN BJT 40 for turning on the NPN BJT 40 after sensing an electrostatic voltage. When the externally coupled trigger element 46 comprises an RC-invertor or a CR circuit, the terminal of the trigger element 46 that is coupled to the base of the NPN BJT 40 as the first device is a trigger point of the RC-invertor or the CR circuit.

<First Aspect of this Invention (with Embedded Trigger Element)>

Some embodiments of the first aspect of this invention are described below, including two cases (first and second embodiments) based on planar devices, and a case (third embodiment) based on 3D devices.

Figure 5A:
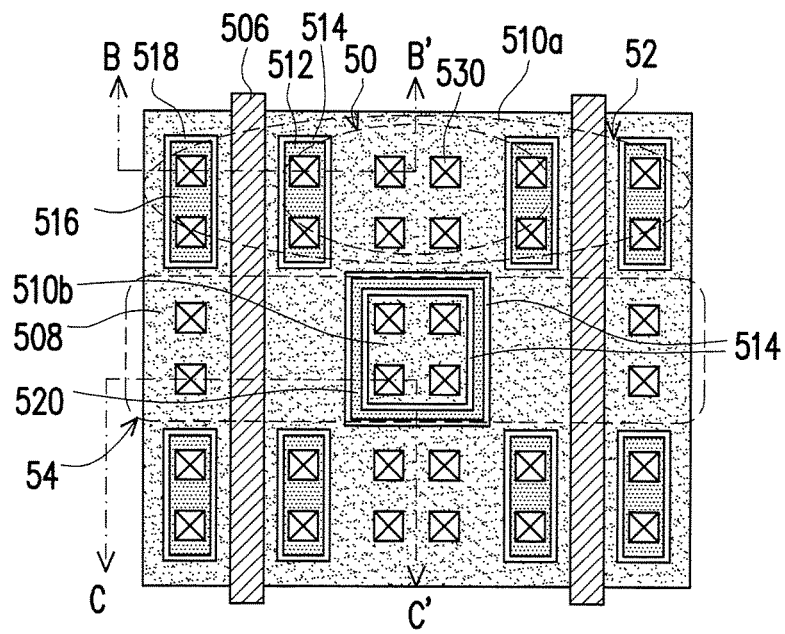
FIG. 5A illustrates a top view of an ESD unit according to a first embodiment of the first aspect of this invention.
Figure 5B:
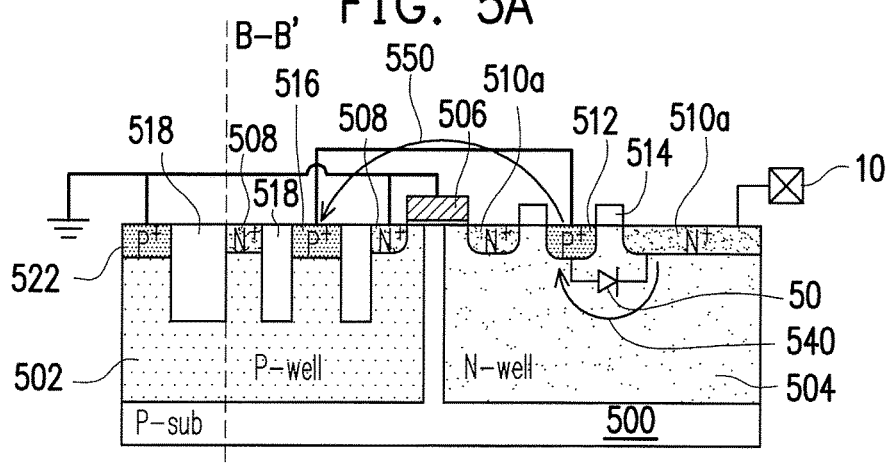
FIG. 5B illustrates the B-B cross-sectional view of the first device in the ESD unit.
Figure 5C:
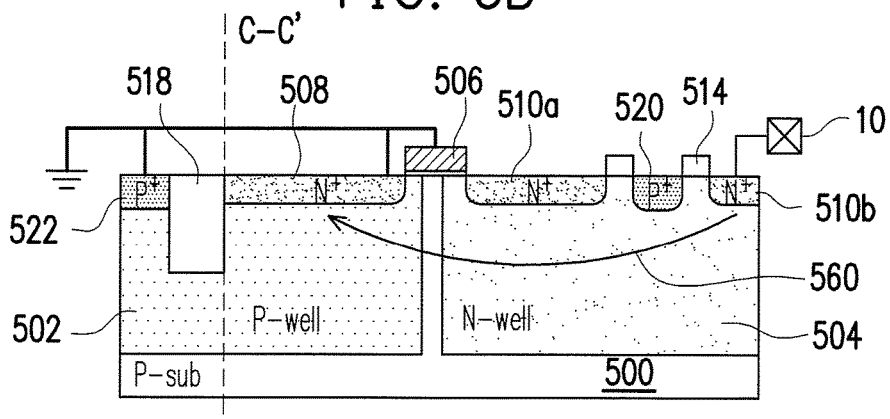
FIG. 5C illustrates the C-C' cross-sectional view of the second device in the ESD unit.

FIG. 5A illustrates a top view of an ESD unit according to the first embodiment of the first aspect of this invention, FIG. 5B illustrates the B-B cross-sectional view of the first device (GGNOS) in the ESD unit, and FIG. 5C illustrates the C-C' cross-sectional view of the second device (SCR). In the first embodiment, the trigger element, the first device and the second device are all planar devices.

Referring to FIG. 5A, the ESD unit includes two GGNMOS devices 52 as the first devices at two sides of one SCR 54 as the second device, and a trigger element 50 embedded in the region of each GGNMOS device 52. Because the GGNMOS devices 52 and the trigger elements 50 are at the two edges of the ESD unit, the ESD unit can be called an edge-trigger ESD unit.

Referring to FIGS. 5A to 5C, the ESD unit is formed based on a P-substrate 500. The GGNMOS devices 52 and the SCR 54 share a P-well 502 in the P-substrate 500, an N-well 504 in the P-substrate 500, two gate lines 506 each overlapping with the neighboring P-well 502 and the N-well 504, an $N^+$-source region 508 in the P-well 502, and an $N^+$-drain region 510a in the N-well 504. The SCR 54 further includes, in the N-well 504, an $N^+$-drain region 510b and a $P^+$-drain region 520 between the $N^+$-drain region 510a and the $N^+$-drain region 510b. Accordingly, in view of each gate line 506, the P-well 502 and the $N^+$-source region 508 are at one side of the gate line 506, and the N-well 504 and the $N^+$-drain regions 510a and 510b are at the other side of the gate line 506. The $N^+$-drain regions 510a and 510b are electrically connected to an I/O pad 10. The gate lines 506, the N+-source region 508 and the P-well 502 are grounded, wherein the P-well 502 is grounded via a pick-up region 522.

Each GGNMOS device 52 as the first device further has a P+-region 512 in the N-well 504 and a P+-region 516 in the P-well 502, wherein the P+-region 512 forms the embedded diode 50 with the N-well 504 and is electrically connected to the P+-region 516. The P+-region 512 in the N-well 504 may be formed with a portion of a patterned SAB layer 514 as a mask, as illustrated in the figures, but may alternatively be formed with a portion of a patterned STI layer or gate layer as a mask. The P+-region 516 in the N-well 504 may be formed with a patterned STI layer 518 as a mask.

As for the SCR 54 as the second device, the P+-region 520 in the N-well 504, the N-well 504, the P-substrate 500, the P-well 502 and the N+-source region 508 in the P-well 502 together constitute a PNPN-type SCR. The P+-region 520 may be formed in the N-well 504 with another portion of the patterned SAB layer 514 as a mask, as illustrated in the figures, but may alternatively be formed with another portion of the patterned STI layer or gate layer as a mask. Moreover, the design that the P+-region 520 accompanies inner and outer portions of the patterned SAB layer 514 as illustrated in FIGS. 5A and 5C is suitable for a high-voltage application. For a normal-voltage application, the inner portion of the patterned SAB layer 514 surrounded by the P+-region 520 (see FIG. 5A), which is shown at the right side of the P+-region 520 in FIG. 5C, can be omitted so that the P+-region 520 contacts the N+-drain region 510b (not shown).

The operation mechanism of the above ESD unit is described below. When an electrostatic voltage being high enough is generated at the I/O pad 10, the diode 50 as the trigger element is turned on in backward bias, and a current 540 from the N+-drain region 510a to the P+-region 512 is generated and is then transmitted to the P+-region 516 in the P-well 502, as indicated by the arrow 550. The current will raise the substrate bias to turn on the GGNMOS device 52 as the first device. After a sufficiently clamp voltage is generated by the GGNMOS device 52, an SCR ESD path 560 is formed with increase in the voltage drop.

Figure 6:
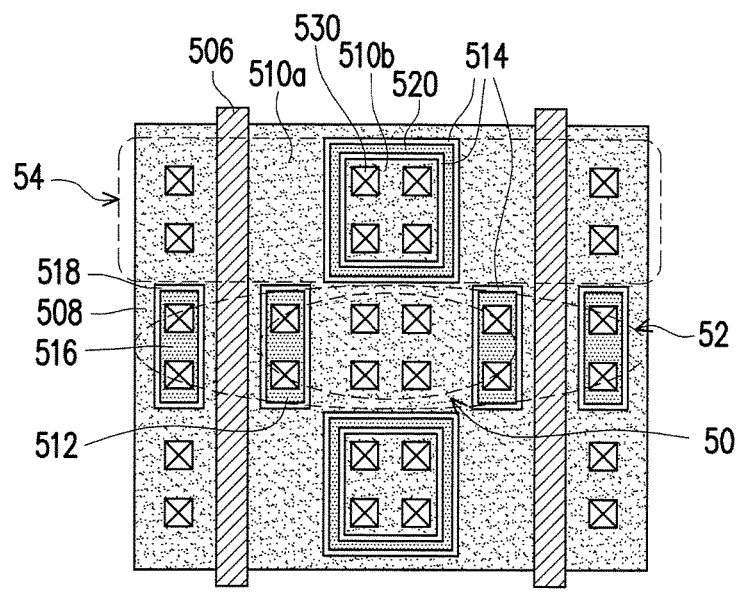
FIG. 6 illustrates a top view of an ESD unit according to a second embodiment of the first aspect of this invention.

FIG. 6 illustrates a top view of an ESD unit according to a second embodiment of the first aspect of this invention. In the second embodiment, the trigger element, the first device and the second device are all planar devices.

The second embodiment is different from the first embodiment in that the ESD unit includes two SCRs 54 as the second devices at two sides of one GGNMOS device 52 as the first device. A trigger element 50 embedded in the region of the GGNMOS device 52. Because the GGNMOS device 52 and the trigger element 50 are at the middle of the ESD unit, the ESD unit can be called a middle-trigger ESD unit.

Figure 7:
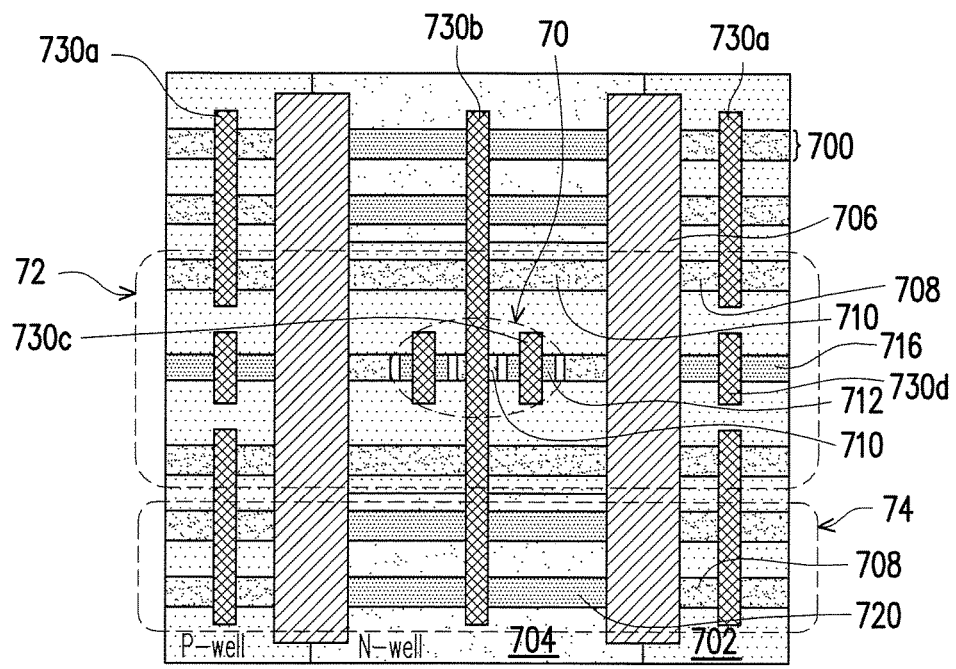
FIG. 7 illustrates a top view of an ESD unit according to a third embodiment of the first aspect of this invention.

FIG. 7 illustrates a top view of an ESD unit according to a third embodiment of the first aspect of this invention. In the third embodiment, the trigger element, the first device and the second device are all 3D devices, such as fin devices.

Referring to FIG. 7, the ESD unit includes two fin-type SCRs 74 as the second devices at two sides of one fin-type GGNMOS device 72 as the first devices, and a fin-type diode 70 as the trigger element embedded in the region of the fin-type GGNMOS device 72. Such ESD is a middle-trigger ESD unit, as the trigger element 70 and the fin-type GGNMOS device 72 are at the middle of the ESD unit. The middle-trigger design can be readily changed into an edge-trigger design in reference of the case of the first and second embodiments.

The ESD unit includes a plurality of fin structures 700, a P-well 702 shared by the two fin-type SCRs 74 and the fin-type GGNMOS device 72, two N-wells 704 respectively in the two fin-type SCRs 74, and two gate lines 706 each crossing over the fin structures 700.

The embedded diode 70 includes a P+-fin segment 712 and an N+-fin segment 710 neighboring to the P+-fin segment 712, wherein the P+-fin segment 712 and the N+-fin segment 710 are disposed on a P-well 702, and the N+-fin segment 710 forms a diode with the P-well 702.

The fin-type GGNMOS device 72 further includes, in view of a gate line 706, at least one N+-fin segment 708 as a source at a second side of the gate line, at least one N+-fin segment 710 as a drain at a first side of the gate line, and a P+-fin segment 716 at the second side of the gate line 706, wherein the at least one N+-fin segment 708 and the at least one N+-fin segment 710 are in the same fin structure(s) 700, the at least one N+-fin segment 708, the at least one N+-fin segment 710 and the P+-fin segment 716 are disposed on the P-well 702, and the P+-fin segment 716 is electrically connected to the P+-fin segment 712. The at least one N+-fin segment 708, the P-well 702 and the at least one N+-fin segment 710 constitute a parasitic NPN BJT in the fin-type GGNMOS device 72.

Each fin-type SCR 74 further includes, in view of a gate line 706, at least one N+-fin segment 708 at the second side of the gate line 706 and on the P-well 702, and at least one P+-fin segment 720 at the first side of the gate line 706 and on the N-well 704. In each fin-type SCR 74, the at least one P+-fin segment 720, the N-well 704, the P-well 702 and the at least one N+-fin segment 708 constitute a PNPN-type SCR.

The at least one N+-fin segment 708 in the fin-type GGNMOS device 72 and the at least one N+-fin segment 708 in an adjacent fin-type SCR 74 are grounded via the same contact line 730a. The N+-fin segment 710 of the embedded diode 70, the at least one N+-fin segment 710 in the fin-type GGNMOS device 72, and the at least one P+-fin segment 720 in the adjacent fin-type SCR 74 are electrically connected to an I/O pad via the same contact line 730b. The P+-fin segment 716 of the fin-type GGNMOS device 72 is electrically connected to the P+-fin segment 712 of the diode 70 via the contact 730d on the P+-fin segment 716, the contact 730c on the P+-fin segment 712, and an interconnect line (not shown).

<Second Aspect of this Invention (with Externally Coupled Trigger Element)>

Some embodiments of the second aspect of this invention are described below, including two cases (fourth and fifth embodiments) based on planar devices, and a case based on 3D devices (sixth embodiment).

Figures 8A, 9:
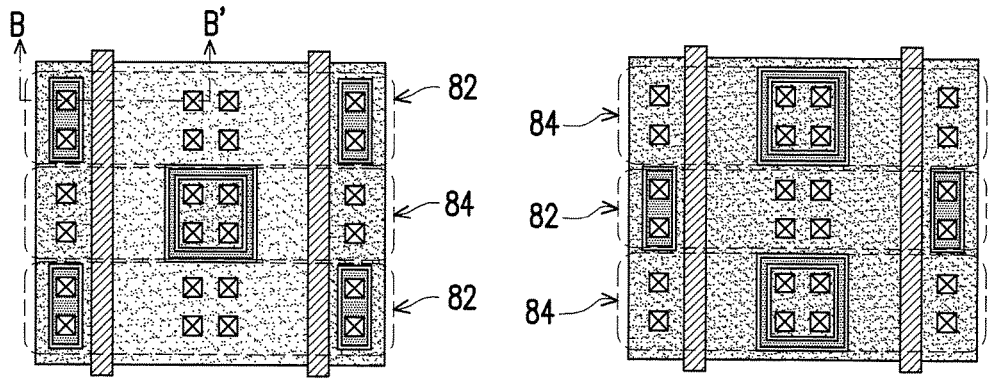
FIG. 8A illustrates a top view of an ESD unit according to a fourth embodiment of the second aspect of this invention.
FIG. 9 illustrates a top view of an ESD unit according to a fifth embodiment of the second aspect of this invention.
Figure 8B:
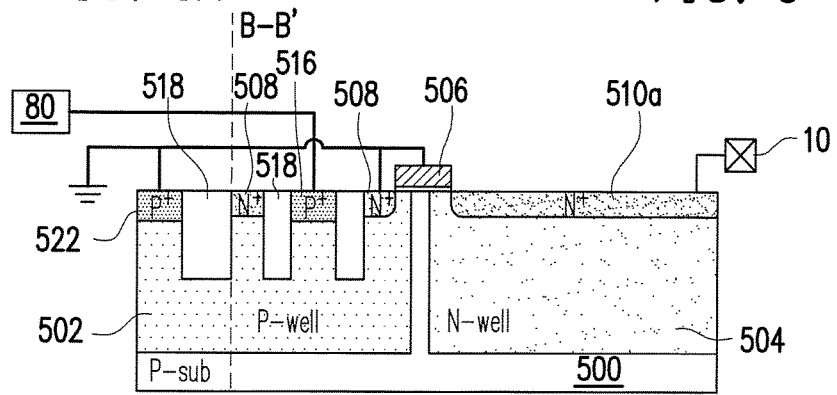
FIG. 8B illustrates the B-B cross-sectional view of the first device in the ESD unit.

FIG. 8A illustrates a top view of an ESD unit according to a fourth embodiment of the second aspect of this invention, and FIG. 8B illustrates the B-B cross-sectional view of the first device in the ESD unit. In the fourth embodiment, the first device and the second device are both planar devices.

Referring to FIGS. 8A and 8B, the fourth embodiment is different from the first embodiment as shown in FIGS. 5A to 5C in that the embedded diode 50 or the P+-region 512 is not formed but an external trigger element 80 is externally coupled to the P-well 502 shared by the GGNMOS devices 82 and the SCR 84. The ESD unit of this fourth embodiment is an edge-trigger ESD unit according to the aforementioned definition.

FIG. 9 illustrates a top view of an ESD unit according to a fifth embodiment of the second aspect of this invention. In the fifth embodiment, the first device and the second device are both planar devices.

The fifth embodiment is different from the fourth embodiment in that the ESD unit includes two SCRs 84 as the second devices at two sides of one GGNMOS device 82 as the first device without an embedded trigger element. The ESD unit of this fifth embodiment is a middle-trigger ESD unit according to the aforementioned definition.

Figure 10:
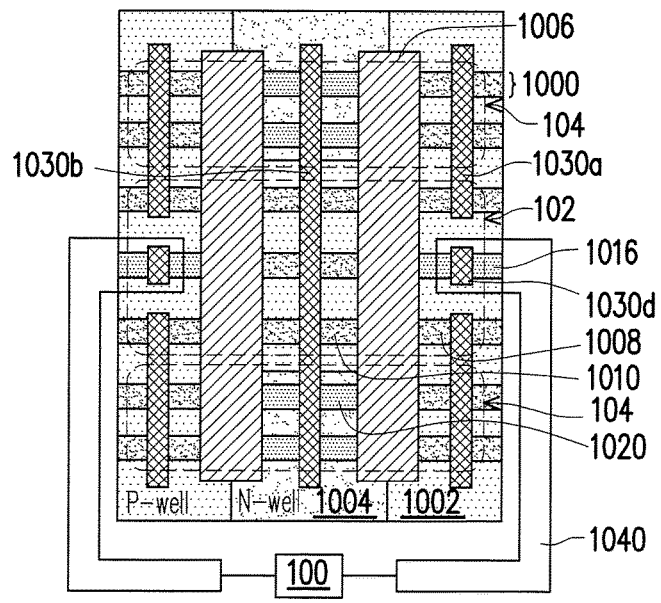
FIG. 10 illustrates a top view of an ESD unit according to a sixth embodiment of the second aspect of this invention.

FIG. 10 illustrates a top view of an ESD unit according to a sixth embodiment of the second aspect of this invention. In the sixth embodiment, the first device and the second device are both fin devices, and the ESD unit is different from the ESD unit in the third embodiment as shown in FIG. 7 mainly in that the embedded trigger element is replaced by an external trigger element.

Referring to FIG. 10, the ESD unit includes two fin-type SCRs 104 as the second devices at two sides of one fin-type GGNMOS device 102 as the first device. The fin-type GGNMOS device 102 and two fin-type SCRs 104 include fin structures 1000, a P-well 1002, two N-wells 1004, two gate lines 1006, $N^+$-fin segments 1008, $N^+$-fin segments 1010, $P^+$-fin segments 1016, $P^+$-fin segments 1020, contact lines 1030a, a contact line 1030b and contacts 1030d that are arranged and configured like the parts 700, 702, 704, 706, 708, 710, 716, 720, 730a, 730b and 730d, respectively, in the ESD unit as shown in FIG. 7, and are different from the latter in not including parts corresponding to the $P^+$-fin segments 712 for forming the embedded trigger element or diode and the contacts 730c on the $P^+$-fin segments 712. Instead of an embedded diode as an embedded trigger element, the ESD unit of the sixth embodiment includes an external trigger element 100 that is externally electrically connected with the contacts 1030d on the $P^+$-fin segments 1016 via interconnect lines 1040. Such ESD is a middle-trigger ESD unit, as the fin-type GGNMOS device 102 is at the middle of the ESD unit. The middle-trigger design can be readily changed into an edge-trigger design in reference of the case of the first and second embodiments.

<Third Aspect of this Invention (without Trigger Element)>

Some embodiments of the third aspect of this invention are described below, including two cases (seventh and eighth embodiments) based on planar devices, and a case based on 3D devices (ninth embodiment).

Figures 11A, 12:
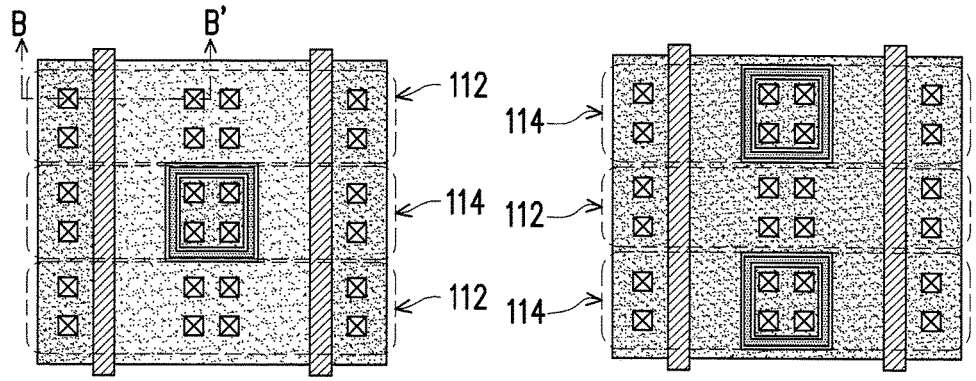
FIG. 11A illustrates a top view of an ESD unit according to a seventh embodiment of the third aspect of this invention.
FIG. 12 illustrates a top view of an ESD unit according to an eighth embodiment of the third aspect of this invention.
Figure 11B:
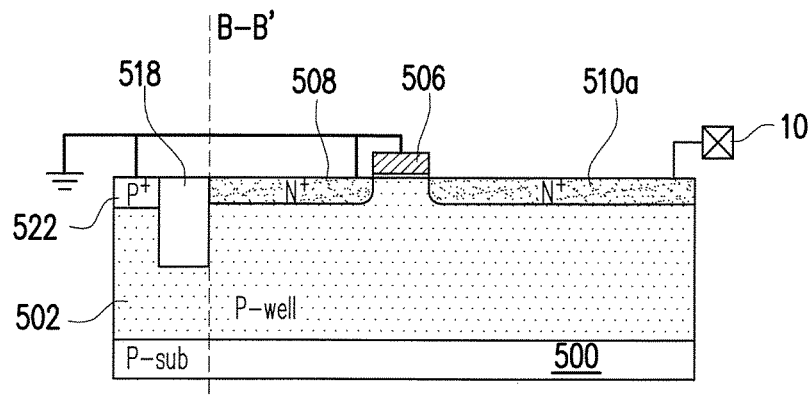
FIG. 11B illustrates the B-B cross-sectional view of the first device in the ESD unit.

FIG. 11A illustrates a top view of an ESD unit according to a seventh embodiment of the third aspect of this invention, and FIG. 11B illustrates the B-B cross-sectional view of the first device in the ESD unit. In the seventh embodiment, the first device and the second device are both planar devices.

Referring to FIG. 11A/11B, the seventh embodiment is different from the fourth embodiment as shown in FIG. 8A/8B in that an N-well (504) is not formed at the opposite side of the P-well 502, that the P-well 502 extends from the source side of the gate line 506 to the drain side of the same and covers the $N^+$-drain region 510a/b so that breakdown will occur between the $N^+$-drain region 510a/b and the P-well 502 lowering the breakdown voltage, that a $P^+$-region (516) and a patterned STI layer (518) for defining the region thereof are not formed in the P-well 502 shared by the GGNMOS devices 112 and the SCR 114 therebetween, and that no external trigger element (80) is coupled to the P-well 502. Accordingly, the $P^+$-region 520 (FIG. 5C), the $N^+$-drain region 510a, the P-substrate 500, the P-well 502, and the $N^+$-source region 508 in the P-well 502 together constitute a PNPN-type SCR as the SCR 114. Since the parasitic BJTs in the GGNMOS devices 112 as the first devices are turned on earlier than the SCR 114 as the second device, the same effects can be made without an external or embedded trigger element.

FIG. 12 illustrates a top view of an ESD unit according to an eighth embodiment of the third aspect of this invention. In the eighth embodiment, the first device and the second device are both planar devices.

The eighth embodiment is different from the seventh embodiment in that the ESD unit includes two SCRs 114 as the second devices at two sides of one GGNMOS device 112 as the first device without an embedded trigger element.

Figure 13:
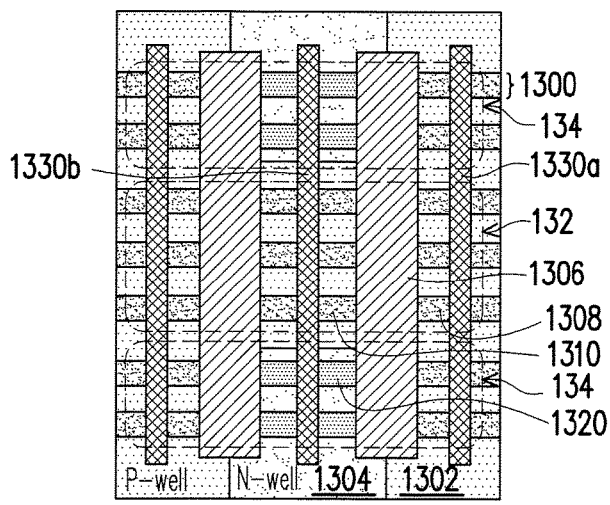
FIG. 13 illustrates a top view of an ESD unit according to a ninth embodiment of the third aspect of this invention.

FIG. 13 illustrates a top view of an ESD unit according to a ninth embodiment of the third aspect of this invention. In the ninth embodiment, the first device and the second device are both fin devices, and the ESD unit is different from the ESD unit in the third embodiment as shown in FIG. 7, or the ESD unit in the sixth embodiment as shown in FIG. 10, mainly in that the trigger element is omitted.

Referring to FIG. 13, the ESD unit includes two fin-type SCRs 134 as the second devices at two sides of one fin-type GGNMOS device 132 as the first device. The fin-type GGNMOS device 132 and two fin-type SCRs 134 include fin structures 1300, a P-well 1302, two N-wells 1304, two gate lines 1306, $N^+$-fin segments 1308, $N^+$-fin segments 1310, $P^+$-fin segments 1320, contact lines 1330a and a contact line 1330b that are arranged and configured like the parts 700, 702, 704, 706, 708, 710, 720, 730a and 730b, respectively, in the ESD unit as shown in FIG. 7, and are different from the latter in not including parts corresponding to the $P^+$-fin segments 712 and $P^+$-fin segments 716 and the contacts 730c and 730d thereon. Briefly, no $P^+$-fin segment for forming an embedded trigger element or for electrically connecting with an external trigger element is formed in the ESD unit of the ninth embodiment without a trigger element. Since the parasitic BJT in the fin-type GGNMOS device 132 as the first device is turned on earlier than the fin-type SCRs 134 as the second devices, the same effects can be made without an embedded or external trigger element.

No matter the ESD unit of this invention is of an edge-trigger type or of a middle-trigger type, or includes planar devices or 3D devices, since the first device that is coupled to the second device in parallel and is turned on earlier than the second device is included in the ESD unit of this invention, the holding current can be increased, so that the latch-up immunity of the ESD unit is improved and the leakage in normal operation is decreased.

Moreover, when the ESD unit of this invention includes a trigger element, no matter the trigger element is embedded or external, the trigger voltage required to trigger the SCR can be lowered so that the effect of preventing ESD damage is improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An electrostatic discharge (ESD) unit, comprising:
   a first device; and
   a second device coupled to the first device in parallel; and
   a trigger element coupled to the first device in series, wherein in an ESD event, the trigger element is turned on by an electrostatic voltage, and the first device is turned on by the turned-on trigger element before the second device is turned on, and wherein the first device comprises, as a first NPN BJT, a parasitic NPN BJT in a GGMOS, or a non-parasitic NPN BJT, the second device comprises a silicon-controlled rectifier (SCR) that comprises a second NPN BJT and a PNP BJT, a base of the first NPN BJT is electrically connected to a terminal of the trigger element, a collector of the PNP BJT, and a base of the second NPN BJT, an emitter of the first NPN BJT is grounded, a collector of the first NPN BJT is electrically connected to an emitter of the PNP BJT and an I/O pad, an emitter of the second NPN BJT is grounded, and a collector of the second NPN BJT is electrically connected to a base of the PNP BJT.

2. The ESD unit of claim 1, wherein in the ESD event, the second device is turned on by the turned-on first device to form an ESD path.

3. The ESD unit of claim 1, wherein the first device comprises at least one GGNMOS or at least one NPN BJT.

4. The ESD unit of claim 1, wherein the second device comprises at least one silicon-controlled rectifier (SCR).

5. The ESD unit of claim 1, wherein the trigger element comprises a diode, an RC-invertor, a diode couple device, or a CR circuit.

6. The ESD unit of claim 5, wherein the diode is formed using an STI layer, a gate layer or a SAB layer as a mask.

7. The ESD unit of claim 1, wherein the trigger element comprises a diode, and the terminal of the trigger element that is electrically connected with the base of the first NPN BJT is a positive electrode of the diode.

8. The ESD unit of claim 1, wherein the trigger element comprises an RC-invertor or a CR circuit, and the terminal of the trigger element that is electrically connected with the base of the first NPN BJT is a trigger point of the RC-invertor or the CR circuit.

9. An electrostatic discharge (ESD) unit, comprising:

at least one first device; and at least one second device, being coupled to the first device in parallel, wherein the first device and the second device are planar devices, the first device and the second device share a gate line, an $N^+$-drain region that is disposed at a first side of the gate line, a P-well that is disposed at least at a second side of the gate line, and an $N^+$-source region in the P-well at the second side of the gate line, and the second device further comprises a first $P^+$-region at the first side of the gate line, wherein the first $P^+$-region, the $N^+$-drain region, the P-well and the $N^+$-source region form a PNPN-type silicon-controlled rectifier (SCR), the $N^+$-drain region is electrically connected to an I/O pad, and the gate line, the $N^+$-source region and the P-well are grounded.

10. The ESD unit of claim 9, wherein there are two first devices arranged at two sides of one second device.

11. The ESD unit of claim 9, wherein there are two second devices arranged at two sides of one first device.

12. The ESD unit of claim 9, wherein the P-well extends from the second side of the gate line to the first side of the gate line and covers the $N^+$-drain region.

13. The ESD unit of claim 9, wherein the P-well is disposed at the second side of the gate line, the ESD unit further comprising: an N-well which is disposed at the first side of the gate line and in which the $N^+$-drain region is formed, and a trigger element coupled to the first device in series, wherein in the ESD event, the trigger element is turned on by an electrostatic voltage, and the first device is turned on by the turned-on trigger element.

14. The ESD unit of claim 13, wherein the trigger element is a diode embedded in the N-well in the first device.

15. The ESD unit of claim 14, wherein the embedded diode is formed using an STI layer, a gate layer or a SAB layer as a mask.

16. The ESD unit of claim 14, wherein the first device further has a second $P^+$-region in the P-well, and a third $P^+$-region in the N-well, and the third $P^+$-region forms the embedded diode with the N-well, and is electrically connected to the second $P^+$-region.

17. The ESD unit of claim 13, wherein the trigger element is coupled to the first device externally.

18. The ESD unit of claim 17, wherein the trigger element comprises an RC-invertor, a diode couple device, or a CR circuit.

19. The ESD unit of claim 17, wherein the first device further has a second $P^+$-region in the P-well, and the second $P^+$-region is electrically connected to the trigger element.

20. An electrostatic discharge (ESD) unit, comprising:

at least one first device; and at least one second device, being coupled to the first device in parallel, wherein the first device and the second device are fin devices, the first device and the second device share a gate line, and share a P-well that is disposed at first and second sides of the gate line in the first device and at the second side of the gate line in the second device, the second device further includes an N-well that is disposed at the first side of the gate line, the gate line crosses over a plurality of fin structures on the P-well and the N-well, the first device further comprises at least one first $N^+$-fin segment as a drain at the first side of the gate line, and at least one second $N^+$-fin segment as a source at the second side of the gate line, wherein the at least one first $N^+$-fin segment and the at least one second $N^+$-fin segment are in the same fin structure(s), and the at least one first $N^+$-fin segment and the at least one second $N^+$-fin segment are disposed on the P-well, the second device further comprises at least one third $N^+$-fin segment at the second side of the gate line and on the P-well, and at least one first $P^+$-fin segment at the first side of the gate line and on the N-well, the at least one first $N^+$-fin segment and the at least one first $P^+$-fin segment are electrically connected to an I/O pad via a first contact line, and the at least one second $N^+$-fin segment and the at least one third $N^+$-fin segment are grounded via a second contact line.

21. The ESD unit of claim 20, wherein there are two first devices arranged at two sides of one second device.

22. The ESD unit of claim 20, wherein there are two second devices arranged at two sides of one first device.

23. The ESD unit of claim 20, further comprising a trigger element coupled to the first device in series, wherein in the ESD event, the trigger element is turned on by an electrostatic voltage, and the first device is turned on by the turned-on trigger element.

24. The ESD unit of claim 23, wherein the trigger element is a diode embedded in a region of the first device.

25. The ESD unit of claim 24, wherein
the first device further comprises a fourth $N^+$-fin segment at the first side of the gate line, a second $P^+$-fin segment at the second side of the gate line, and a third $P^+$-fin segment at the first side of the gate line and neighboring to the fourth $N^+$-fin segment,
the fourth $N^+$-fin segment, the second $P^+$-fin segment and the third $P^+$-fin segment are disposed on the P-well,
the fourth $N^+$-fin segment forms the embedded diode with the P-well,
the third $P^+$-fin segment is electrically connected to the second $P^+$-fin segment, and
the fourth $N^+$-fin segment is also electrically connected to the I/O pad via the first contact line.

26. The ESD unit of claim 23, wherein the trigger element is coupled to the first device externally.

27. The ESD unit of claim 26, wherein the trigger element comprises an RC-invertor, a diode couple device, or a CR circuit.

28. The ESD unit of claim 26, wherein
the first device further comprises a second $P^+$-fin segment at the second side of the gate line and on the P-well, and
the second $P^+$-fin segment is electrically connected to the trigger element.

* * * * *